United States Patent
Cheng et al.

(10) Patent No.: US 8,614,444 B2
(45) Date of Patent: Dec. 24, 2013

(54) TOP-GATE TRANSISTOR ARRAY SUBSTRATE

(75) Inventors: Huang-Chung Cheng, Hsinchu (TW); Yu-Chih Huang, Hsinchu (TW); Po-Yu Yang, Hsinchu (TW); Shin-Chuan Chiang, Taipei (TW); Huai-An Li, Taoyuan County (TW)

(73) Assignees: Chunghwa Picture Tubes, Ltd., Padeh, Taoyuan (TW); National Chiao Tung University, Hsinchu (TW)

( * ) Notice: Subject to any disclaimer, the term of this patent is extended or adjusted under 35 U.S.C. 154(b) by 5 days.

(21) Appl. No.: 13/286,902

(22) Filed: Nov. 1, 2011

(65) Prior Publication Data

US 2013/0009144 A1    Jan. 10, 2013

(30) Foreign Application Priority Data

Jul. 5, 2011    (TW) .............................. 100212279 U

(51) Int. Cl.
 *H01L 29/10*    (2006.01)
(52) U.S. Cl.
 USPC ............... 257/43; 257/E33.064; 257/E31.126
(58) Field of Classification Search
 USPC .............................. 257/43, E33.064, E31.126
 See application file for complete search history.

(56) References Cited

FOREIGN PATENT DOCUMENTS

| TW | 083106643 | 5/1999 |
|----|-----------|--------|
| TW | 085109758 | 9/1999 |
| TW | 086102122 | 11/1999 |
| TW | 096125377 | 3/2008 |
| TW | 097101667 | 10/2008 |
| TW | 098114724 | 2/2010 |
| TW | 098131227 | 6/2010 |

*Primary Examiner* — Amar Movva
(74) *Attorney, Agent, or Firm* — Muncy, Geissler, Olds & Lowe, PLLC

(57) ABSTRACT

A top-gate transistor array substrate includes a transparent substrate with a plane, an ion release layer, a pixel array, and a first insulating layer. The ion release layer is disposed on the transparent substrate and completely covers the plane. The pixel array is disposed on the ion release layer and includes a plurality of transistors and a plurality of pixel electrodes. Each of the transistors includes a source, a drain, a gate and a MOS (metal oxide semiconductor) layer. The drain, the source and the MOS layer are disposed on the ion release layer. The pixel electrodes are electrically connected to the drains respectively. The gate is disposed above the MOS layer. The first insulating layer is disposed between the MOS layers and the gates. The MOS layer contacts the ion release layer. The ion release layer can release a plurality of ions into the MOS layers.

8 Claims, 1 Drawing Sheet

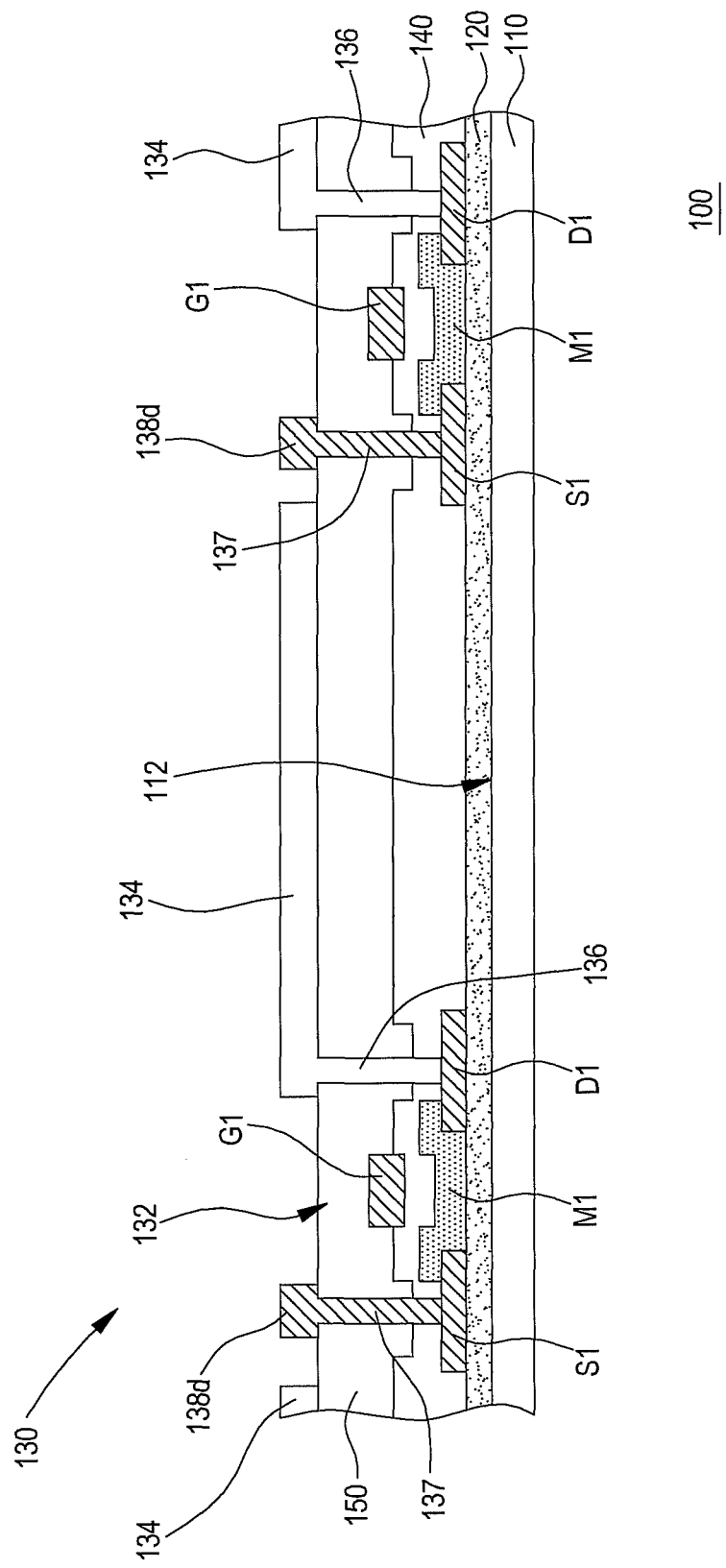

TOP-GATE TRANSISTOR ARRAY SUBSTRATE

CROSS-REFERENCE TO RELATED APPLICATION

This application claims the benefit of Taiwan Patent Application No. 100212279, filed on Jul. 5, 2011, which is hereby incorporated by reference for all purposes as if fully set forth herein.

BACKGROUND OF THE INVENTION

1. Field of Invention

The present invention relates to a transistor array substrate, and more particularly, to a top-gate transistor array substrate.

2. Related Art

Currently, a liquid crystal display (LCD) with a metal oxide semiconductor (MOS) layer is present. The thin-film transistor (TFT) of the LCD has an active layer made of MOS. When the LCD is in operation, a positive voltage is applied to a gate of the TFT to enable the gate to generate an electric field.

A plurality of oxygen ions ($O^{2-}$) in the semiconductor layer are driven by the electric field and move towards the gate. When the oxygen ions move towards the gate, an oxygen vacancy occurs in the MOS layer. That is to say, the regions lacking oxygen ions are present in the MOS layer. Once too many oxygen ions move towards the gate, the resistance of the MOS layer will change, and it influences the operation of the LCD, thereby resulting in decrease of the reliability of the LCD.

SUMMARY OF THE INVENTION

The present invention is directed to a top-gate transistor array substrate with an ion release layer for inhibiting the formation of the oxygen vacancy.

The present invention provides a top-gate transistor array substrate including a transparent substrate, an ion release layer, a pixel array, and a first insulating layer. The transparent substrate has a plane. The ion release layer is disposed on the transparent substrate and completely covers the plane. The pixel array is disposed on the ion release layer and includes a plurality of transistors and a plurality of pixel electrodes. Each of the transistors includes a source, a drain, a MOS (metal oxide semiconductor), and a gate. The source is disposed on the ion release layer. The drain is disposed on the ion release layer, wherein the pixel electrodes are electrically connected to the drains respectively. The MOS layer is disposed on the ion release layer and in contact with the ion release layer, the source and the drain. The MOS layer partially covers the source and the drain, and the ion release layer is used for releasing a plurality of ions into the MOS layer. The gate is disposed above the MOS layer. The first insulating layer is disposed between the MOS layers and the gates, and covers the MOS layers, the sources and the drains.

According to an embodiment of the present invention, the ion release layer is a titanium dioxide ($TiO_2$) layer.

According to an embodiment of the present invention, the titanium dioxide layer is an amorphous titanium dioxide layer or a polycrystalline titanium dioxide layer.

According to an embodiment of the present invention, the ion release layer is a ceramic layer.

According to an embodiment of the present invention, the MOS layer is an indium gallium zinc oxide (IGZO) layer or an indium tin zinc oxide (ITZO) layer.

According to an embodiment of the present invention, the top-gate transistor array substrate further comprises a second insulating layer, wherein the second insulating layer is disposed on the first insulating layer and covers the transistors, and the pixel electrodes are disposed on the second insulating layer.

According to an embodiment of the present invention, the pixel array further comprises a plurality of data lines, and the data lines are disposed on the second insulating layer and electrically connected to the sources respectively.

According to an embodiment of the present invention, the pixel array further comprises: a plurality of first conductive columns disposed in the second insulating layer and connected between the pixel electrodes and the drains; and a plurality of second conductive columns, disposed in the second insulating layer and connected between the data lines and the sources. Based on the foregoing, since the MOS layer contacts the ion release layer, the ion release layer can release a plurality of ions into the MOS layer, so as to inhibit the formation of oxygen vacancy in the MOS layer. Thus, the change of the resistance of the MOS layer is avoided, thereby improving the reliability of the LCD.

In order to make the aforementioned and other objectives and advantages of the present invention comprehensible, embodiments accompanied with figures are described in detail below.

BRIEF DESCRIPTION OF THE DRAWINGS

The present invention will become more fully understood from the detailed description given herein below for illustration only, and thus are not limitative of the present invention, and wherein:

FIG. 1 is a schematic cross-sectional view of a top-gate transistor array substrate according to an embodiment of the present invention.

DETAILED DESCRIPTION OF THE INVENTION

FIG. 1 is a schematic cross-sectional view of a top-gate transistor array substrate according to an embodiment of the present invention. Referring to FIG. 1, a top-gate transistor array substrate 100 of this embodiment includes a transparent substrate 110, an ion release layer 120 and a pixel array 130. The transparent substrate 110 has a plane 112, and the ion release layer 120 is disposed on the transparent substrate 110 and completely covers the plane 112.

The pixel array 130 is disposed on the ion release layer 120, and includes a plurality of transistors 132 and a plurality of pixel electrodes 134. The pixel electrodes 134 are electrically connected to the transistors 132 respectively. The pixel electrodes 134 may be transparent conductive films, and the material of the pixel electrode 134 is, for example, indium tin oxide (ITO) or indium zinc oxide (IZO).

Each of the transistors 132 is a MOS field effect transistor (MOSFET), so each of the transistors 132 includes a gate G1, a source S1, a drain D1 and a MOS layer M1. The sources S1, the drains D1 and the gates G1 may be metal layers, and the MOS layers M1 may be indium gallium zinc oxide (IGZO) layers or indium tin zinc oxide (ITZO) layers.

In the same transistor 132, the source S1, the drain D1 and the MOS layer M1 are disposed on the ion release layer 120. The MOS layer M1 contacts the ion release layer 120, the source S1 and the drain D1, and partially covers the source S1 and the drain D1, as shown in FIG. 1. The gate G1 is disposed above the MOS layer M1, so that the MOS layer M1 is located between the gate G1 and the drain D1, and between the gate G1 and the source S1.

The top-gate transistor array substrate 100 may further include a first insulating layer 140, and the first insulating layer 140 is disposed between the MOS layers M1 and the gates G1, so that the gates G1 are disposed on the first insulating layer 140. Furthermore, the first insulating layer 140 covers the MOS layers M1, the sources S1 and the drains D1.

The top-gate transistor array substrate 100 may further include a second insulating layer 150, and the pixel array 130 may further include a plurality of first conductive columns 136. The second insulating layer 150 is disposed on the first insulating layer 140 and covers the transistors 132. The pixel electrodes 134 are disposed on the second insulating layer 150. The first conductive columns 136 are disposed in the second insulating layer 150 and are connected between the pixel electrodes 134 and the drains D1. Thus, through the first conductive column 136, the pixel electrode 134 is electrically connected to the drain D1. In addition, the material of the first conductive column 136 may be the same as the material of the pixel electrode 134.

In this embodiment, the pixel array 130 may further include a plurality of data lines 138d and a plurality of second conductive columns 137. The second conductive columns 137 are disposed in the second insulating layer 150 and are connected between the data lines 138d and the sources S1. Thus, the data lines 138d can be electrically connected to the sources S1 respectively through the second conductive columns 137, so that a pixel voltage can be transferred to the sources S1 through the data lines 138d.

In addition, the pixel array 130 may further include a plurality of scan lines. The scan lines may be disposed between the first insulating layer 140 and the second insulating layer 150 and be connected the gates G1. The scan lines cross the data lines 138d, so that the scan lines and the data lines 138d are arranged in a grid. Moreover, each of the gates G1 may be integrated with a scan line to form one. In detail, the gates G1 of the transistors 132 in the same row may have a strip shape, and the gates G1 are connected to each other to form a metal line, wherein the metal line is the scan line.

It should be noted that, in other embodiment, the top-gate transistor array substrate 100 may not include any second insulating layer 150, and the pixel electrodes 134 may be disposed on the first insulating layer 140 and located between two adjacent scan lines. Therefore, the second insulating layer 150 as shown in FIG. 1 is merely illustrated as an example, but not intended to limit the present invention.

The ion release layer 120 may be a compound of transition metal, for example, a transition metal oxide. In this embodiment, the ion release layer 120 may be a titanium dioxide layer or a ceramic layer. The titanium dioxide layer may be an amorphous titanium dioxide layer or a polycrystalline titanium dioxide layer, and the titanium dioxide layer may be made by sputtering.

When the top-gate transistor array substrate 100 is in operation, in each of the transistors 132, a positive voltage is applied to the gate G1, so that the gate G1 generates an electric field. Thus, a plurality of oxygen ions in the MOS layer M1 are driven by the electric field generated from the gate G1, and the oxygen ions move towards the gate G1. At this time, since the MOS layer M1 contacts the ion release layer 120, the ion release layer 120 can release a plurality of ions into the MOS layer M1.

Accordingly, when the ion release layer 120 is a titanium dioxide layer, the ions released by the ion release layer 120 are oxygen ions, so the ion release layer 120 can timely supply a plurality of oxygen ions to the MOS layer M1, so as to inhibit the formation of the oxygen vacancy in the MOS layer M1. Therefore, it prevents the formation of regions lacking oxygen ions in the MOS layer M1, or reduces the regions lacking oxygen ions. Thus, the change of the resistance of the MOS layer M1 is avoided, and the influence on the top-gate transistor array substrate 100 in operation is reduced, thereby improving the reliability of the LCD.

In addition, when the ion release layer 120 is an amorphous titanium dioxide layer or a polycrystalline titanium dioxide layer, the ion release layer 120 may have many grain boundaries therein. When the ion release layer 120 releases a plurality of oxygen ions, the oxygen ions will travel into the MOS layer M1 along the grain boundaries. Thus, the ion release layer 120 can effectively release the oxygen ions to timely supply a plurality of oxygen ions to the MOS layer M1.

It should be noted that, when the titanium dioxide layer releases oxygen ions, a phase transition occurs in the titanium dioxide layer, so that the resistance of the titanium dioxide layer changes. However, titanium dioxide has a very high resistance. Even if the phase transition occurs, the titanium dioxide still can keep good electrical insulating property. Therefore, when the top-gate transistor array substrate 100 is in operation, the titanium dioxide layer as the ion release layer 120 can keep a quite high resistance, so that the transistors 132 cannot be electrically connected to one another through the ion release layer 120.

Based on the foregoing, during the process that the top-gate transistor array substrate is in operation, the ion release layer can release a plurality of ions into the MOS layer, so that the ion release layer can inhibit the formation of the oxygen vacancy in the MOS layer, so as to avoid the change of the resistance of the MOS layer, thereby improving the reliability of the LCD.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A top-gate transistor array substrate, comprising: a transparent substrate, having a plane; an ion release layer, disposed on the transparent substrate and completely coveting the plane; a pixel array, disposed on the ion release layer and comprising a plurality of transistors and a plurality of pixel electrodes, wherein each of the transistors comprises:
   a source disposed on the ion release layer;
   a drain disposed on the ion release layer, wherein the pixel electrodes are electrically connected to the drains respectively;
   a metal oxide semiconductor (MOS) layer disposed on the ion release layer and contacting the ion release layer, the source, and the drain wherein the MOS layer partially covers the source and the drain, and the ion release layer is used for releasing a plurality of ions into the MOS layer
   a gate disposed above the MOS layer; and
   a first insulating layer disposed between the MOS layers and the gates and covering the MOS layers, the sources, and the drains.

2. The top-gate transistor array substrate according to claim 1, wherein the ion release layer is a titanium dioxide layer.

3. The top-gate transistor array substrate according to claim 2, wherein the titanium dioxide layer is an amorphous titanium dioxide layer or a polycrystalline titanium dioxide layer.

4. The top-gate transistor array substrate according to claim 1, wherein the ion release layer is a ceramic layer.

5. The top-gate transistor array substrate according to claim 1, wherein each MOS layer is an indium gallium zinc oxide (IGZO) layer or an indium tin zinc oxide (ITZO) layer.

6. The top-gate transistor array substrate according to claim 1, further comprising a second insulating layer, wherein the second insulating layer is disposed on the first insulating layer and covers the transistors and the pixel electrodes are disposed on the second insulating layer.

7. The top-gate transistor array substrate according to claim 6, wherein the pixel array further comprises a plurality of data lines and the data lines are disposed on the second insulating layer and electrically connected to the sources respectively.

8. The top-gate transistor array substrate according to claim 7, wherein the pixel array further comprises:
- a plurality of first conductive columns disposed in the second insulating layer and connected between the pixel electrodes and the drains; and
- a plurality of second conductive columns disposed in the second insulating layer and connected between the data lines and the sources.

* * * * *